US009887311B2

(12) United States Patent
Kurosawa et al.

(10) Patent No.: US 9,887,311 B2
(45) Date of Patent: Feb. 6, 2018

(54) SEMICONDUCTOR MODULE HAVING A LIGHT-TRANSMISSIVE INSULATING BODY

(71) Applicant: KABUSHIKI KAISHA TOSHIBA, Tokyo (JP)

(72) Inventors: Tetsuya Kurosawa, Yokkaichi Mie (JP); Yoshihisa Imori, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/252,127

(22) Filed: Aug. 30, 2016

(65) Prior Publication Data
US 2017/0244003 A1 Aug. 24, 2017

(30) Foreign Application Priority Data

Feb. 18, 2016 (JP) .................. 2016-028778

(51) Int. Cl.
H01L 31/173 (2006.01)
H01L 33/56 (2010.01)
H01L 33/62 (2010.01)
H01L 31/054 (2014.01)
H01L 31/048 (2014.01)

(52) U.S. Cl.
CPC ........ *H01L 31/173* (2013.01); *H01L 31/0481* (2013.01); *H01L 31/0547* (2014.12); *H01L 33/56* (2013.01); *H01L 33/62* (2013.01)

(58) Field of Classification Search
None
See application file for complete search history.

(56) References Cited

U.S. PATENT DOCUMENTS

| 6,943,378 | B2 | 9/2005 | Kek et al. | |
| 2006/0163595 | A1* | 7/2006 | Hsieh | H01L 33/22 257/95 |
| 2008/0315236 | A1* | 12/2008 | Lu | H01L 33/387 257/98 |
| 2010/0252103 | A1* | 10/2010 | Yao | H01L 25/0756 136/256 |
| 2014/0078687 | A1* | 3/2014 | Kohara | H01L 23/142 361/746 |
| 2014/0084305 | A1* | 3/2014 | Fujimoto | H01L 31/173 257/82 |
| 2016/0315235 | A1* | 10/2016 | Konishi | H01L 33/54 |

FOREIGN PATENT DOCUMENTS

JP 2013251410 A 12/2013

* cited by examiner

Primary Examiner — Ali Naraghi
(74) Attorney, Agent, or Firm — Patterson & Sheridan, LLP

(57) ABSTRACT

A semiconductor module includes a light emitting element, a semiconductor element including a light receptor circuit disposed to receive light from the light emitting element, a light-transmissive insulating body disposed between the light emitting element and the semiconductor element, at least one of a first surface thereof facing the semiconductor element and a second surface thereof facing the light emitting element including a ragged region, a first light-transmissive bonding resin formed between the light emitting element and the light-transmissive insulating body, and a second light-transmissive bonding resin formed between the semiconductor element and the light-transmissive insulating body.

20 Claims, 7 Drawing Sheets

SEMICONDUCTOR MODULE HAVING A LIGHT-TRANSMISSIVE INSULATING BODY

CROSS-REFERENCE TO RELATED APPLICATIONS

This application is based upon and claims the benefit of priority from Japanese Patent Application No. 2016-028778, filed on Feb. 18, 2016, the entire contents of which are incorporated herein by reference.

FIELD

The embodiments described herein generally relate to a semiconductor module, in particular a semiconductor module having a light-transmissive insulating plate.

BACKGROUND

In general, a primary circuit operated at a low operating voltage and a secondary circuit operated at a high operating voltage are electrically insulated from each other, and signal transmission between the primary and secondary circuits is carried out optically for safety reasons.

DETAILED DESCRIPTION

Figure 1:
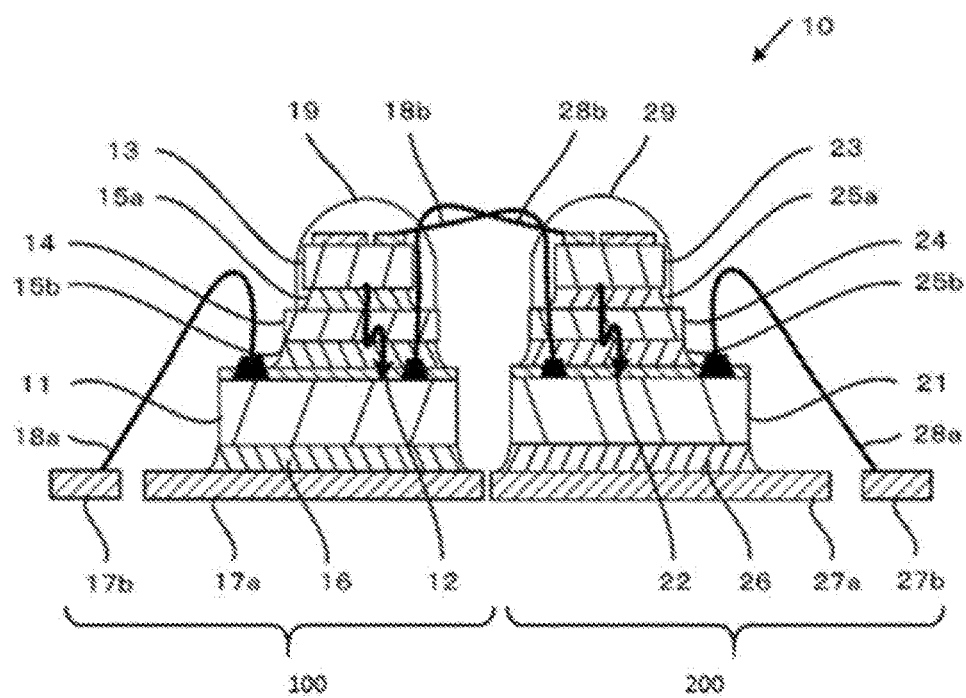
FIG. 1 is a cross-sectional view a semiconductor module according to a first embodiment.

According to an embodiment, a semiconductor module includes a light emitting element, a semiconductor element including a light receptor circuit disposed to receive light from the light emitting element, a light-transmissive insulating body disposed between the light emitting element and the semiconductor element, at least one of a first surface thereof facing the semiconductor element and a second surface thereof facing the light emitting element including a ragged region, a first light-transmissive bonding resin formed between the light emitting element and the light-transmissive insulating body, and a second light-transmissive bonding resin formed between the semiconductor element and the light-transmissive insulating body.

Embodiments are hereinafter described with reference to the drawings. In the drawings, the same reference numerals denote the same or similar elements, and detailed description thereof is omitted.

(First Embodiment)

A semiconductor module according to a first embodiment is described with reference to FIGS. 1-7. FIG. 1 is a cross-sectional view illustrating a semiconductor module 10 according to the first embodiment. The semiconductor module 10 includes a first semiconductor module 100 which has a first semiconductor element and a second semiconductor module 200 which has a second semiconductor element. The first semiconductor module 100 and the second semiconductor module 200 are connected by wire or the like.

The following describes the structure of the semiconductor module 10. As illustrated in FIG. 1, the semiconductor module 10 of the present embodiment includes a first semiconductor element 11 having a primary circuit. A first insulator 14 having irregularities (e.g., a rough portion, a ragged region) on the upper and lower surfaces thereof is provided on the first semiconductor element 11. The first semiconductor element 11 has a Light receiving element (e.g., photodiode), which will be described below.

A first light emitting element 13 that emits first light 12 is provided on the first semiconductor element 11 via the first insulator 14 formed of a material having a light-transmissive property with respect to the first light 12.

Bonding resins 15a and 15b that are transparent to the first light 12 are provided, respectively, between the first light emitting element 13 and the first insulator 14 and between the first insulator 14 and the first semiconductor element 11. In other words, the first light emitting element 13 and the first insulator 14 are bonded to each other with the bonding resin 15a, and the first insulator 14 and the first semiconductor element 11 are bonded to each other with the bonding resin 15b.

The first semiconductor element 11 is joined to a die pad 17a with an electrically conductive adhesive 16. The first semiconductor element 11 is connected to a lead 17b via a wire 18a The first light emitting element 13 is covered with an inner resin 19.

Next, the second semiconductor module 200 will be described in detail. The second semiconductor module 200 has a similar configuration as the first semiconductor module 100. Specifically, he second semiconductor module 200 includes a second semiconductor element 21 which has a secondary circuit that operates at a higher voltage than the primary circuit. A second insulator 24 having irregularities on the upper and lower surfaces thereof is provided on the second semiconductor element 21. The second semiconductor element 21 has a light receiving element (e.g., photodiode), which will be described below.

The second light emitting element 23 that emits second light 22 is provided on the second semiconductor element 21 via the second insulator 24 formed of a material having a light-transmissive property with respect to the second light 22.

Bonding resins 25a and 25b that are transparent to the second light 22 are provided, respectively, between the second light emitting element 23 and the second insulator 24 and between the second insulator 24 and the second semiconductor element 21. In other words, the second light emitting element 23 and the second insulator 24 are bonded to each other with the bonding resin 25a, and the second insulator 24 and the second semiconductor element 21 are bonded to each other with the bonding resin 25b.

The second semiconductor element 21 is joined to a die pad 27a with an electrically conductive adhesive 26. The second semiconductor element 21 is connected to a lead 27b via a wire 28a.

The second light emitting element 23 is covered with an inner resin 29.

The first light emitting element 13 is connected to the second semiconductor element 21 by a wire 18b. The second light emitting element 23 is connected to the first semiconductor element 11 by wire 28b.

The whole semiconductor module 10 is covered with an outer resin 31 (See FIG. 6).

Materials having high insulating properties, such as sapphire and quartz glass, are suitable for the first and the second insulators 14 and 24. A light-transmissive ceramic may be used for the material. The thickness of the first and second insulators 14 and 24 is about 450 μm.

Each of the bonding resins 15a, 15b, 25a, 25b is a silicon paste having insulating properties, for example.

The electrically conductive adhesive 16 is a silver paste, a solder, or the like, for example.

The inner resins 19 and 29 are an encapsulating member to decrease the stress imposed on the first and second light emitting elements 13 and 23 by the outer resin 31 (See FIG. 6), and formed of silicone resin, for example. The inner resins 19 and 29 are soft resins having a low modulus of elasticity than the outer resin 31.

Next, the first and the second insulator 14 and 24 will be described in detail.

Figure 2A:
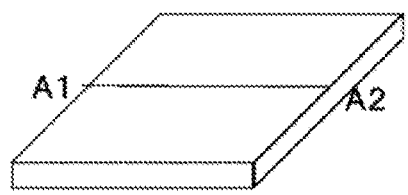
FIGS. 2A and 2B schematically illustrate a first insulator of the semiconductor module according to the first embodiment.
Figure 2B:
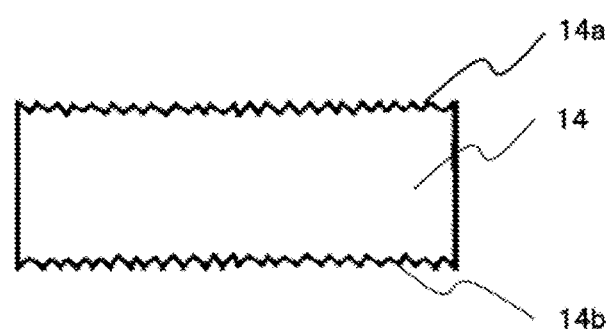

FIGS. 2A and 2B are a schematic view showing the first insulator 14. FIG. 2A is a perspective view of the first insulator 14. FIG. 2B is a cross-sectional view of the first insulator 14 taken along line A1-A2 in FIG. 2A, where 14a is an upper surface of the insulator 14, and 14b is a lower surface of the insulator 14.

The upper surface 14a and the lower surface 14b of the first insulator 14 are uneven. That is, the upper surface 14a and the lower surface 14b are rough. For example, the average height (Ra) is 10 nm~70 nm, and the maximum height (Ry) is 30 nm~500 nm. Preferably, Ra is 10 nm~30 nm, and Ry is 50 nm~200 nm (Ra and Ry are both defined by the JIS standard).

Because the upper and lower surfaces 14a and 14b of the first insulator 14 have roughness, the entire surface area of the upper and lower surfaces 14a and 14b increases, and the adhesion between the first insulator 14 and the bonding resin 15a and 15b is strengthened.

Rough surfaces can be formed by a grinding wheel, etching, laser or the like, but it is not limited thereto.

The second insulator 24 also has the same structure as the first insulator, and description thereof will be omitted.

Next, the first and the second light emitting element 13 and 23 will be described in detail.

Figure 3:
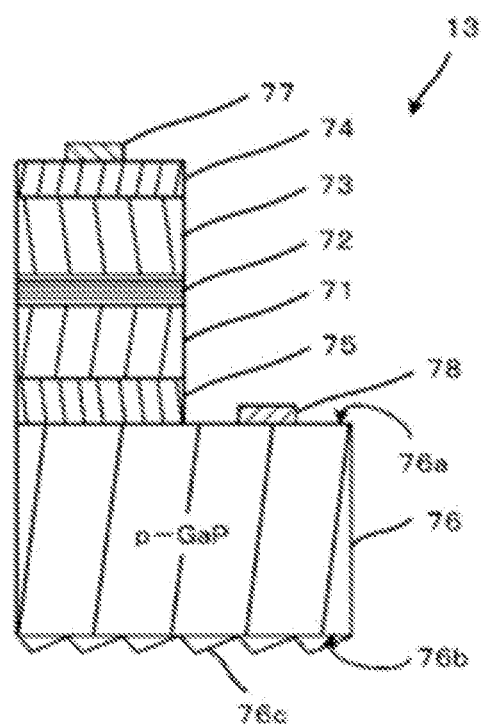
FIG. 3 is a cross-sectional view of a first light emitting element of the semiconductor module.

FIG. 3 is a cross-sectional view of the first light emitting element 13. As shown in FIG. 3, the first light emitting element 13 has a stacked structure of an active layer 72, an n-type clad layer 73, and an n-type contact layer 74 on a p-type clad layer 71 in this order. The p-type clad layer 71 is, for example, a layer of p-InGaAlP; the active layer 72 is, for example, a layer of InGaAlAs/GaAlAMQW (Multiple Quantum Well); the n-type clad layer 73 is, for example, a layer of n-InGaALP; and the n-type contact layer 74 is, for example, a layer of n-GaAs.

The p-type clad layer 71 is bonded to a first surface 76a of a p-GaP support substrate 76 with a p-InGaP bonding layer 75. An n-electrode 77 is formed on the n-type contact layer 74, and a p-electrode 78 is formed on the first surface 76a of the p-type support substrate 76.

The first light emitting element 13 is mounted on the first semiconductor element 11 such that the second surface 76b, which is a light emitting surface, faces a light receiving surface of the photodiode 11c.

The second light emitting element 23 has the same structure as the first light-emitting element 13, and description thereof is omitted.

Next, a circuit configuration of the semiconductor module 10 will be described in detail.

Figure 4:
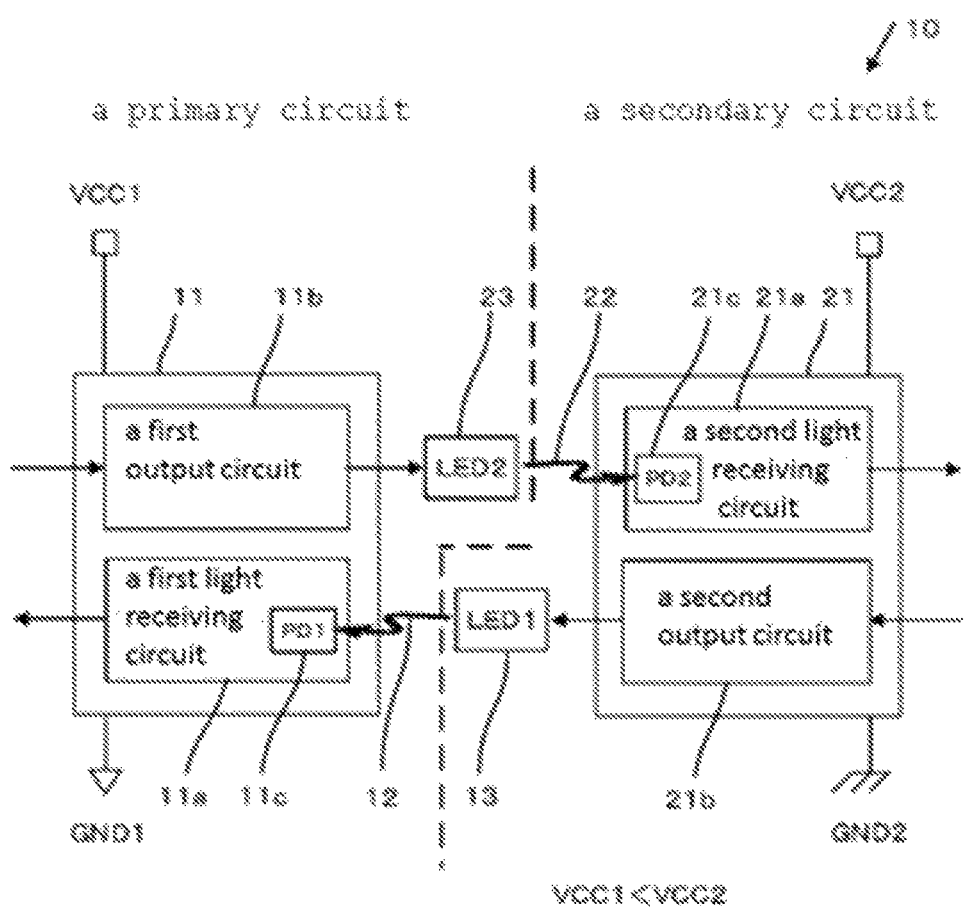
FIG. 4 is a block diagram of first and second semiconductor elements of the semiconductor module.

FIG. 4 is a block diagram of the first and second semiconductor elements 11 and 21. As shown in FIG. 4, the first semiconductor element 11 is connected between a power supply terminal having a power supply voltage VCC1 and a reference terminal having a reference potential GND1. The second semiconductor element 21 is connected between a power supply terminal having a power supply voltage VCC2 and a reference terminal having a reference potential GND2. The power supply voltage VCC2 is higher than the power supply voltage VCC1. The reference terminal having the reference potential GND2 is electrically insulated from the reference terminal having the reference potential GND1.

The first semiconductor element 11 includes a first light receiving circuit 11a and a first output circuit 11b as the primary circuit. The first light receiving circuit 11a includes a photodiode 11c. The second semiconductor element 21 includes a second light receiving circuit 21a and a second output circuit 21b as the secondary circuit. The second light receiving circuit 21a includes a photodiode 21c.

The second output circuit 21b is electrically connected to the first light emitting element 13. The first output circuit 11b is electrically connected to the second light emitting element 23.

The first light emitting element 13 is mounted on the first semiconductor element 11 such that the light 12 emitted from the first light emitting element 13 can be received by the photodiode 11c. The second light emitting element 23 is mounted on the second semiconductor element 21 such that the light 22 emitted from the second light emitting element 23 can be received by the photodiode 21c.

Each of the photodiodes 11c and 21c is a silicon photodiode. The first and second light emitting elements 13 and 23 are light emitting diodes (LEDs) which emit near-infrared light within the light receiving range of the silicon photodiode. For example, the first and the second light emitting elements 13 and 23 can emit near-infrared light of which wavelength is 770 nm.

The first output circuit 11b processes an input signal from outside and outputs a resulting signal to the second light emitting element 23. The second light emitting element 23 emits the second light 22 in accordance with the output signal. The second light receiving circuit 21a detects the second light 22 with the photodiode 21c, generates the detection result (e.g., photocurrent), and outputs a resulting signal to outside.

Similarly, the second output circuit 21b processes an input signal from outside and outputs a resulting signal to the first light emitting element 13. The first light emitting element 13 emits the first light 12 in accordance with the output signal. The first light receiving circuit 11a detects the first light 12 with the photodiode 11c, generates the detection result (e.g., photocurrent), and outputs a resulting signal to outside.

Thus, a signal is transmitted from the primary circuit to the secondary circuit by the optical coupling, and a signal is transmitted from the secondary circuit to the primary circuit by the optical coupling. The signal transmission from the primary circuit to the secondary circuit and the signal transmission from the secondary circuit to the primary circuit are electrically insulated and performed independently.

Figure 5:
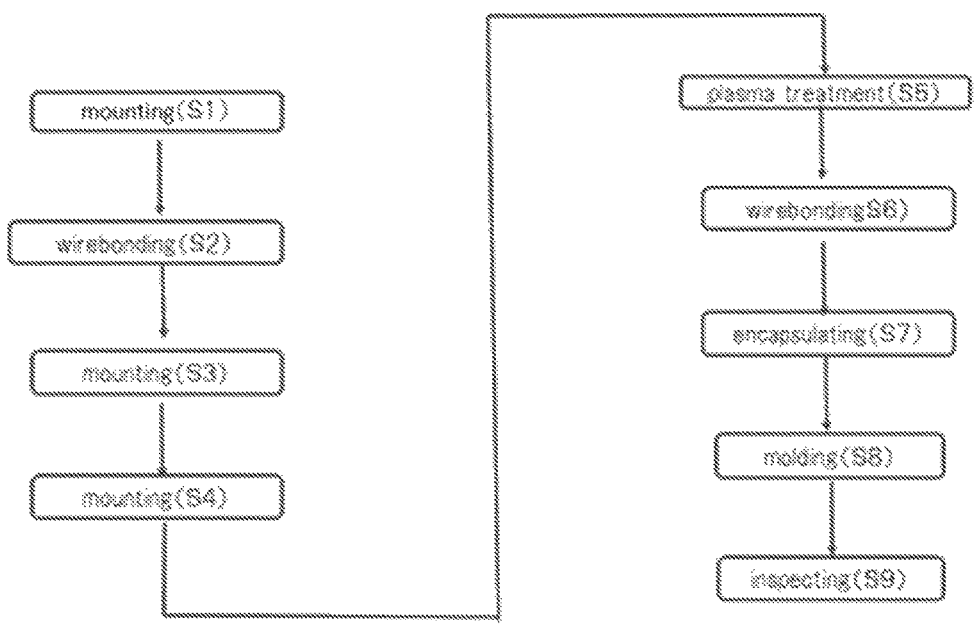
FIG. 5 is a flow chart showing an assembling process of the semiconductor module.

Next, a method of manufacturing the semiconductor module 10 will be described with reference to FIG. 5. FIG. 5 is a flow chart showing an assembling process of the semiconductor module 10.

First, parts such as the first and second semiconductor elements 11 and 21, the first and second light emitting elements 13 and 23, the first and second insulators 14 and 24, and a lead frame are prepared. The upper and the lower surfaces 14a and 14b of the first and second insulators 14 and 24 are rough as described above.

The first semiconductor element 11 is mounted on the die pad 17a of the lead frame with silver paste disposed in between, and the second semiconductor element 21 is mounted on the die pad 27a of the lead frame with silver paste disposed in between (S1).

The first semiconductor element 11 and the lead 17b of the lead frame are connected to each other by wire bonding, and the second semiconductor element 21 and the lead 27b of the lead frame are connected to each other by wire bonding (S2).

The first insulator 14 is mounted on the first semiconductor element 11 with the bonding resin 15b disposed in between while monitoring a location of the first semiconductor element 11 by a machine. Similarly, the second insulator 24 is mounted on the second semiconductor element 21 with the bonding resin 25b disposed in between while monitoring a location of the second semiconductor element 21 by a machine (S3). The first and the second insulator look frosted because of their rough upper and lower surfaces.

The first light emitting element 13 is mounted on the first insulator 14 with the bonding resin 15a disposed in between, and the second light emitting element 23 is mounted on the second insulator 24 with the bonding resin 25a disposed in between (S4). At this time, the bonding resin 15a, 15b, 25a, and 25b are transparent and provided on and under the first and second insulators 14 and 24. Since the bonding resin 15a, 15b, 25a, and 25b are filled into the rough portion of the surfaces of the first and second insulators 14 and 24, the frost of the first and second insulators 14 and 24 disappears. The frost of the first and second insulators 14 and 24 is caused by irregular light reflection by the rough surfaces. When the bonding resins 15a, 15b, 25a, and 25b are filled in the rough portion of the surfaces, the surfaces become flat and prevent irregular light reflection. For that reason, transparency of the first and second insulators 14 and 24 area the same as the case not have the rough portion on the surfaces of the first and second insulators 14 and 24.

Next, surfaces of the first and second light emitting elements 13 and 23 are cleaned by plasma treatment (S5).

The first light emitting element 13 and a pad of the second semiconductor element 21 are electrically connected to each other by wire bonding, and the second light emitting element 23 and a pad of the first semiconductor element 11 are electrically connected to each other by wire bonding (S6). Then, each of the first and second light emitting elements 13 and 23 is encapsulated with silicone resin or the like (S7).

The first and second semiconductor elements 11 and 21, the first and second light emitting elements 13 and 23, and a portion of the lead frame including the die pads 17a and 27a are sealed by molding with epoxy resin or the like (S8). Finally, structures and characteristics of the semiconductor module 10 resulting from the above steps S1-S8 are inspected (S9). As a result, the semiconductor module 10 is manufactured.

According to the first embodiment, since the transparent first and second insulators 14 and 24 look frosted because of their rough surfaces, the first and second insulators 14 and 24 can be detected by a machine or the like to mount on the first and second semiconductor elements 11 and 21, respectively. Furthermore, since alignment of the first and second insulators 14 and 24 with the first and second semiconductor elements 11 and 21 become easier, an amount of displacement can be reduced.

In the manufacturing method shown by the flowchart in FIG. 5, the order of the mounting steps (S1, S3, S4) and the wire bonding steps (S2, S6) may be changed. To be more specific, first the mounting steps (S1, S3, S4) may be performed in this order, and then the wire bonding steps (S2, S6) may be performed in this order.

Next, the configuration of the semiconductor module 10 formed in a package, and an application example of the semiconductor module 10 will be described.

Figure 6A:
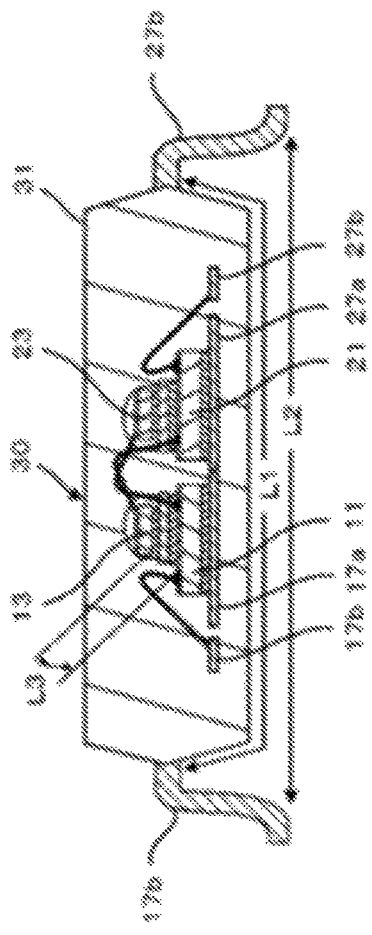
FIGS. 6A and 6B illustrate the semiconductor module formed in a package.
Figure 6B:
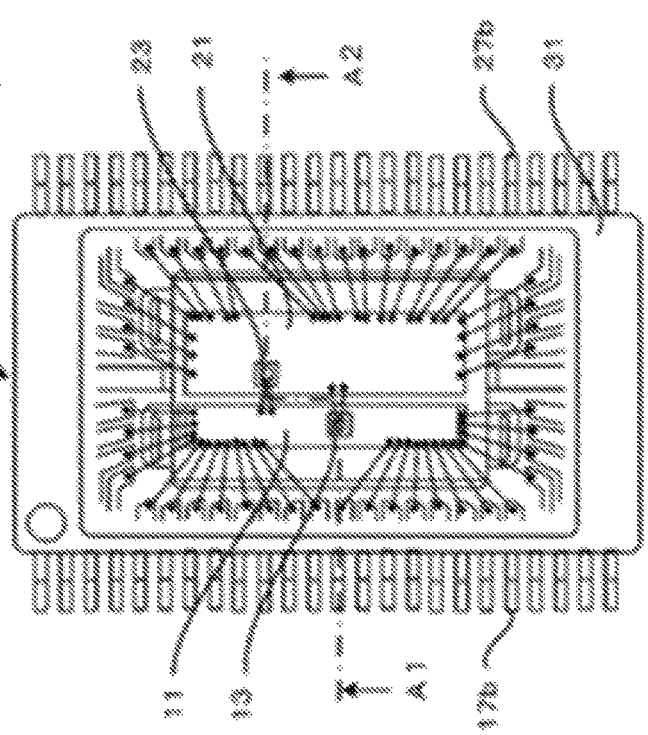

FIGS. 6A and 6B illustrate the semiconductor module formed in a package. Specifically, FIG. 6A is a plan view thereof, and FIG. 6B is a cross-sectional view thereof taken along line A1-A2 and viewed in the direction of arrows shown in FIG. 6A.

As illustrated in FIGS. 6A and 6B, the semiconductor module 10 is formed in a package 30. The package 30 is a resin package of a dual inline package (DIP) type in which leads extend from two opposed sides of the package 30, for example.

The first and second semiconductor elements 11 and 21, the first and second light emitting elements 13 and 23, and a portion of a lead frame including the die pads 17a and 27a are integrally covered with the outer resin 31. The leads 17b and 27b extend from two opposed sides of the outer resin 31. The outer resin 31 is a thermosetting resin such as epoxy, for example, and harder than the inner resin 19 and 29 and the bonding reins 15a, 15b, 25a, and 25b. It is noted that although the leads 17b and 27b extend from a region within the outer resin 31 to the outside of the outer resin 31, a structure of the leads 17b and 27b within the outer resin 31 is partially are omitted in FIGS. 6A and 6B.

Figure 7:
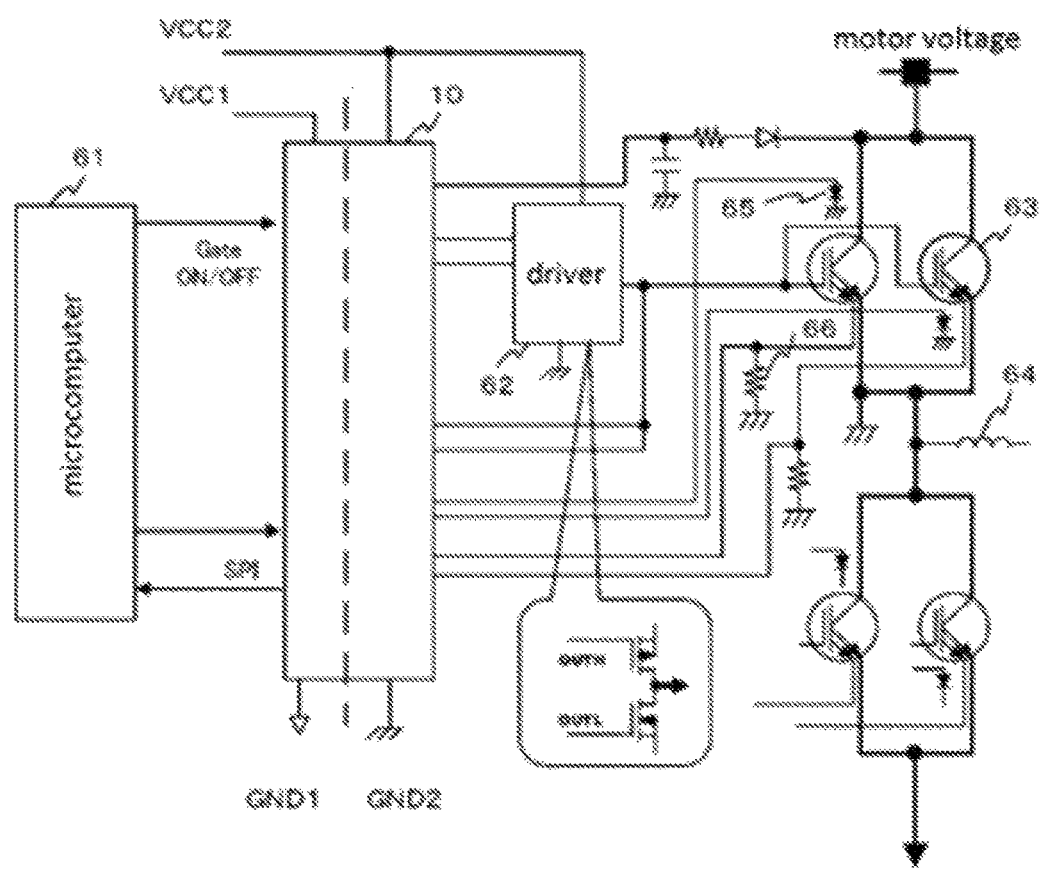
FIG. 7 illustrates an application example of the semiconductor module, which is used in a power semiconductor device.

Next, a drive circuit of a power semiconductor device including the semiconductor module 10 of the first embodiment will be described as an application example. As illustrated in FIG. 7, the semiconductor module 10 is used as a gate driver for a power semiconductor element which drives a three-phase motor (not illustrated). It is noted that FIG. 7 illustrates only a portion of the semiconductor module 10 corresponding to one of the three phases.

In the semiconductor module 10, the first semiconductor element 11 is connected to a microcomputer 61 for controlling the three-phase motor, and the second semiconductor element 21 (not shown in FIG. 6) of the semiconductor module 10 is connected to an IGBT (a power semiconductor element) 63 via an external driver 62. The IGBT 63 is connected to a stator coil 64.

The reason that the driver 62 is disposed externally from the semiconductor module 10 is that a specification required for the driver 62 may be different depending on a type of the IGBT 63. This configuration gives the semiconductor module 10 versatility.

A plurality of the IGBTs 63 may be connected in parallel depending on required current capacity. A diode 65 functions as a sensor to detect overheat of the IGBT 63. A resistor 66 functions as a sensor to detect overcurrent and short circuit of the IGBT 63.

The power supply voltage VCC1 is 5V, for example. The power supply voltage VCC2 is 30V, for example. The voltage (at the secondary side) of the three-phase motor is from 600V to 1200V, for example.

In order to secure a withstand voltage conforming to the safety regulation (IEC60950) specified in the Japanese Industrial Standards (JIS), it is preferable that the package 30 illustrated in FIGS. 6A and 6B have an outer creepage distance L1 of 5 mm or more and a clearance L2 of 5 mm or more. Further, it is preferable that the outer creepage distance L1 is equal to the clearance L2.

The outer creepage distance L1 is a distance along the bottom surface and the lower side surfaces of the outer resin 31 between the leads 17b and 27b that extend at the opposite sides of the outer resin 31. The clearance L2 is a distance on a straight line between the leads 17b and 27b.

In addition, in order to secure a desirable withstand voltage, it is preferable that an inner creepage distance L3 of the first light emitting element 13 be 1.2 mm or more. The inner creepage distance L3 is the shortest distance between the first light emitting element 13 and a bonding pad of the first semiconductor element 11 along top and side surfaces of the first insulator 14 and a top surface of the first semiconductor element 11.

The semiconductor module according to the present embodiment enables forming of a smaller inverter circuit because the primary circuit and the secondary circuit which have different operating voltages are formed in a same package via the insulators.

Further, according to the present embodiment, the upper and lower surfaces of the first and second insulators 14 and 24 are rough, and thus can improve adhesion of the first and second insulators 14 and 24 with the bonding resins 15a, 15b, 25a, and 25b. In addition, the roughness improves adhesiveness of the wire bonding with the first and second insulators 14 and 24. In the wire bonding process, wire bonding is formed on the top surface of the first light-emitting element 13 by pressing and vibrating the wire bonding material with ultrasonic waves on the first light emitting element 13. Since the first insulator 14 has the rough upper surface, the adhesion bet the first insulator 14 and the first light-emitting element becomes strong and the first light-emitting element 13 becomes less likely to move with respect to the first insulator 14 even when the vibration is transferred to the first light-emitting element 13. Since the first light-emitting element 13 is less likely to move, the vibration can be properly applied to the bonding surface (top surface of the first light-emitting element 13), and bonding property of the bonding wire and the first light emitting element 13 increases. For the same reason, adhesiveness of the wire bonding with the second insulator 24 can be improved.

In addition, it is easier to detect the insulators 14 and 24 with the rough surfaces than a transparent insulator by a machine or the like because of clear contrast with the background. Furthermore, as the rough surfaces of the insulators 14 and 24 do not need to be mirror-finished by polishing the surfaces, the manufacturing cost would not be extensively different by using the insulators 14 and 24 having the rough surfaces.

(Second Embodiment)

Next, a semiconductor module according to a second embodiment will be described with reference to FIG. 8. In the second embodiment, configuration of the semiconductor module is same as that of the first embodiment except for the structures of the first and second insulators 14 and 24.

Figure 8A:
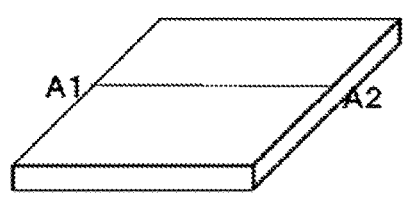
FIGS. 8A and 8B schematically illustrate a first insulator according to a second embodiment.
Figure 8B:
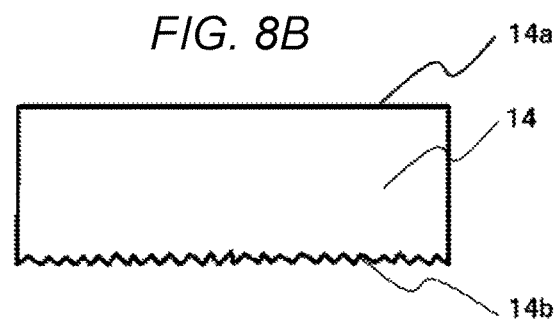

FIGS. 8A and 8B schematically illustrate the first insulator 14. FIG. 8A is a perspective view of the first insulator 14, and FIG. 8B is a cross-sectional view of the first insulator 14 taken along line A1-A2 in FIG. 8A, where 14a is an upper surface of the first insulator 14, and 14b is a lower surface of the first insulator 14.

In the second embodiment, the first insulator 14 has a mirror surface on the upper surface 14a and a rough surface on the lower surface 14b. Here, the mirror surface means that the surface has substantially no roughness and is smooth. For example, the average height (Ra) is less than 10 nm, and the maximum height (Ry) is 20 nm~50 nm. The first insulator 14 is formed by polishing only the upper surface of the first insulator 14 after grinding to a desired thickness by a grinding wheel (e.g., 450 μm). The second insulator 24 has the same structure as the first insulator 14.

According to the semiconductor module 10 of the second embodiment, adhesion between the bonding resins 15b and 25b and the first and second insulators 14 and 24, respectively, increases because of rough lower surfaces of the insulators 14 and 24. Also, compared to the first embodiment, since the total area of the rough surfaces is smaller, it is possible to suppress the first and second insulators 14, 24 from being cracked by an impact applied to the rough surfaces.

In the second embodiment, the rough surface may not extend over the entire lower surfaces of the first and second insulators 14 and 24, and extends over only a part of the lower surfaces instead. Furthermore, not limited to the lower surfaces, it may be either of the upper or lower surfaces.

(Third Embodiment)

Figure 9A:
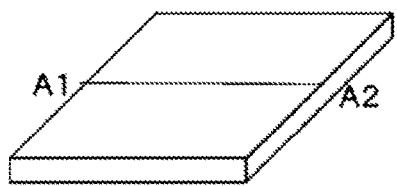
FIGS. 9A and 9B schematically illustrate a first insulator according to a third embodiment.
Figure 9B:
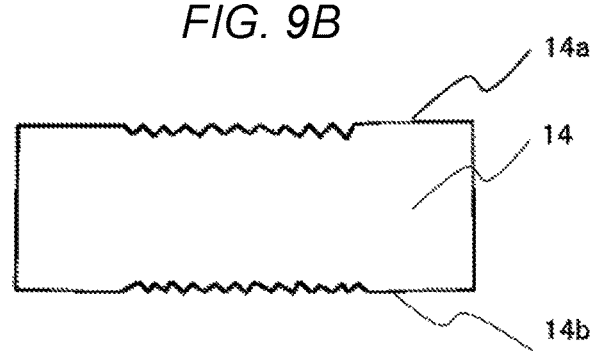

Next, a semiconductor module according to a third embodiment will be described with reference to FIGS. 9A and 9B. In the third embodiment, configuration of the semiconductor module is same as those of the first and second embodiments, except for the structure of the first and second insulators 14 and 24.

As shown in FIG. 9, the first insulator 14 of the present embodiment has a rough surface in central portions of the upper surface 14a and the lower surface 14b. In other words, the outer peripheral portions of the upper and lower surfaces 14a and 14b are a mirror surface. The first insulator 14 is formed by polishing only the outer peripheral portions of the upper and lower surfaces 14a and 14b after grinding to a desired thickness by a grinding wheel (e.g., 450 μm). Here, the outer peripheral portion in the present embodiment refers to the outer region with respect to the central portion. The second insulator 24 has the same structure as the first insulator 14.

According to the semiconductor module of the third embodiment, compared to the first and second embodiments, since the outer peripheral portions of the upper and lower surfaces 14a and 14b are each a mirror surface, the inner resin 19, which is formed on the upper surface 14a, is less likely to flow down along the bonding resin 15b and the first semiconductor element 11. The inner resin 19 is located on the first insulator 14 so as to cover the first light emitting element 13 and the bonding resin 15a. For example, if the outer peripheral portion of the upper surface 14a of the first insulator 14 is rough, since the inner resin 19 has a low surface tension against the upper surface 14a, the inner resin 19 may flow down to the bonding resin 15b and the first semiconductor element 11 which is located under the first insulator 14. The inner resin 19 and the outer resin 31 are less likely to adhere to each other. For that reason, if the inner resin 19 flow along the first insulator 14, adhesion between the outer resin 31 and the semiconductor module 10 may become weaker and the outer resin 31 may be peeled off from the semiconductor module 10. According to the present embodiment, the inner resin 19 is less likely to flow down, that is, the semiconductor module 10 can be fixed to the outer resin 31 more firmly.

Further, since the central portion of the upper and lower surfaces 14a and 14b of the first insulator 14 has the rough surfaces, the same advantage as that of the first and the second embodiments can be obtained.

In the third embodiment, the rough surfaces are formed on the central portions of the upper and lower surfaces 14a and 14b of the first insulator 14. Alternatively, such a surface can be formed on only one surface of the first insulator 14 (or the second insulator 24).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor module, comprising:
   a light emitting element;
   a semiconductor element including a light receptor circuit disposed to receive light from the light emitting element;
   a light-transmissive insulating body disposed between the light emitting element and the semiconductor element, at least one of a first surface thereof facing the semiconductor element and a second surface thereof facing the light emitting element including a ragged region;
   a first light-transmissive bonding resin formed between the light emitting element and the light-transmissive insulating body; and
   a second light-transmissive bonding resin formed between the semiconductor element and the light-transmissive insulating body.

2. The semiconductor module according to claim 1, wherein
   an average height of the ragged region is equal to or greater than 10 nm, and a maximum height of the ragged region is equal to or greater than 30 nm.

3. The semiconductor module according to claim 1, wherein
   the light-transmissive insulating body is formed of one of sapphire, quartz glass, and light-transmissive ceramic.

4. The semiconductor module according to claim 1, wherein
   the ragged region is formed on the second surface of the light-transmissive insulating body.

5. The semiconductor module according to claim 4, wherein
   the second surface of the light-transmissive insulating body includes the ragged region and a peripheral region surrounding the ragged region, a roughness of the peripheral region being less than a roughness of the ragged region.

6. The semiconductor module according to claim 5, wherein
   the peripheral region has a mirror surface.

7. The semiconductor module according to claim 5, wherein
   the first light-transmissive bonding resin is not formed on at least part of the peripheral region of the light-transmissive insulating body.

8. The semiconductor module according to claim 1, wherein
   the ragged region is formed on the first and second surfaces of the light-transmissive insulating body.

9. The semiconductor module according to claim 1, wherein
   each of the first and second light-transmissive bonding resins includes a silicon paste.

10. The semiconductor module according to claim 1, further comprising:
    a cover resin covering the light-emitting element and the first light-transmissive bonding resin, wherein
    the covering resin is not formed on at least part of a peripheral region of the second surface of the light-transmissive insulating body.

11. A semiconductor module comprising first and second sub-modules, each of the first and second sub-modules comprising:
    a light emitting element;
    a semiconductor element including a light receptor circuit disposed to receive light from the light emitting element and an output circuit;
    a light-transmissive insulating body disposed between the light emitting element and the semiconductor element, at least one of a first surface thereof facing the semiconductor element and a second surface thereof facing the light emitting element including a ragged region;
    a first light-transmissive bonding resin formed between the light emitting element and the light-transmissive insulating body; and
    a second light-transmissive bonding resin formed between the semiconductor element and the light-transmissive insulating body, wherein
    the light emitting element of the first sub-module is electrically connected to the output circuit of the second sub-module, and the light emitting element of the second sub-module is electrically connected to the output circuit of the first sub-module.

12. The semiconductor module according to claim 11, wherein
    an average height of the ragged regions of the first and second sub-modules is equal to or greater than 10 nm, and a maximum height of the ragged regions is equal to or greater than 30 nm.

13. The semiconductor module according to claim 11, wherein
    in each of the first and second sub-modules, the light-transmissive insulating body is formed of one of sapphire, quartz glass, and light-transmissive ceramic.

14. The semiconductor module according to claim 11, wherein
    in each of the first and second sub-modules, the ragged region is formed on the second surface of the light-transmissive insulating body.

15. The semiconductor module according to claim 14, wherein
    in each of the first and second sub-modules, the second surface of the light-transmissive insulating body includes the ragged region and a peripheral region surrounding the ragged region, a roughness of the peripheral region being less than a roughness of the ragged region.

16. The semiconductor module according to claim 15, wherein in each of the first and second sub-modules, the peripheral region has a mirror surface.

17. The semiconductor module according to claim 15, wherein
in each of the first and second sub-modules, the first light-transmissive bonding resin is not formed on at least part of the peripheral region of the light-transmissive insulating body.

18. The semiconductor module according to claim 11, wherein
in each of the first and second sub-modules, the ragged region is formed on the first and second surfaces of the light-transmissive insulating body.

19. The semiconductor module according to claim 11, wherein
in each of the first and second sub-modules, each of the first and second light-transmissive bonding resins includes a silicon paste.

20. The semiconductor module according to claim 11, wherein
each of the first and second sub-modules further includes a cover resin covering the light-emitting element and the first light-transmissive bonding resin, and
in each of the first and second sub-modules the covering resin is not formed on at least part of a peripheral region of the second surface of the light-transmissive insulating body.

* * * * *